(12) United States Patent
Tan

(10) Patent No.: US 8,853,838 B2
(45) Date of Patent: Oct. 7, 2014

(54) LEAD FRAME AND FLIP PACKAGING DEVICE THEREOF

(71) Applicant: Silergy Semiconductor Technology (Hangzhou) Ltd, Hangzhou (CN)

(72) Inventor: Xiaochun Tan, Hangzhou (CN)

(73) Assignee: Silergy Semiconductor Technology (Hangzhou) Ltd, Hangzhou (CN)

(*) Notice: Subject to any disclaimer, the term of this patent is extended or adjusted under 35 U.S.C. 154(b) by 0 days.

(21) Appl. No.: 14/022,877

(22) Filed: Sep. 10, 2013

(65) Prior Publication Data
US 2014/0117520 A1    May 1, 2014

(30) Foreign Application Priority Data
Oct. 31, 2012    (CN) .......................... 2012 1 0428578

(51) Int. Cl.
*H01L 23/498* (2006.01)

(52) U.S. Cl.
CPC ............................... *H01L 23/49811* (2013.01)
USPC .......................... 257/673; 257/666; 257/676

(58) Field of Classification Search
USPC ......................................... 257/666, 676, 673
See application file for complete search history.

(56) References Cited

U.S. PATENT DOCUMENTS

| | | | | |
|---|---|---|---|---|
| 4,937,656 A | * | 6/1990 | Kohara | 257/676 |
| 5,126,821 A | * | 6/1992 | Okinaga et al. | 257/784 |
| 5,907,769 A | * | 5/1999 | Corisis | 438/123 |
| 2007/0130759 A1 | | 6/2007 | Harnden | |

* cited by examiner

*Primary Examiner* — Roy Potter
(74) *Attorney, Agent, or Firm* — Michael C. Stephens, Jr.

(57) ABSTRACT

Disclosed are various lead frame and flip chip package structures. In one embodiment, a method can include: (i) a plurality of pins, wherein each of the plurality of pins includes an intermediate portion and an extension portion that are connected to each other; (ii) where the intermediate portion is located at an interior region of the lead frame, the intermediate portion extending to a first side edge of the lead frame; and (iii) where the extension portion is located at a peripheral region of the lead frame, the peripheral region being different than the first side edge.

8 Claims, 4 Drawing Sheets

US 8,853,838 B2

LEAD FRAME AND FLIP PACKAGING DEVICE THEREOF

RELATED APPLICATIONS

This application claims the benefit of Chinese Patent Application No. 201210428578.8, filed on Oct. 31, 2012, which is incorporated herein by reference in its entirety.

FIELD OF THE INVENTION

The present invention relates to the field of semiconductors, and more particularly relates to a lead frame and a flip-chip package utilizing the lead frame.

BACKGROUND

With increasing integration of semiconductor integrated circuits (ICs), as well as increasing operating speeds and power consumption requirements, IC packaging structure design is becoming more difficult. Current package structures include wire bonding and flip-chip package structures. A wire bonding package structure can bond solder balls located on the IC or chip to a lead frame through a gold wire, and pins in the lead frame for electrical conductivity to peripheral circuitry. Generally, a flip-chip package structure is implemented by placing an inverted chip on a substrate (e.g., a printed-circuit board [PCB]) through solder joints in order to provide electrical/mechanical connectivity without such pins.

SUMMARY

In one embodiment, a lead frame can include: (i) a plurality of pins, wherein each of the plurality of pins includes an intermediate portion and an extension portion that are connected to each other; (ii) where the intermediate portion is located at an interior region of the lead frame, the intermediate portion extending to a first side edge of the lead frame; and (iii) where the extension portion is located at a peripheral region of the lead frame, the peripheral region being different than the first side edge.

In one embodiment, a flip-chip package can include: (i) a chip, where an upper surface of the chip includes a plurality of bumps; (ii) the lead frame as above, where each the bump is connected to an intermediate portion of the plurality of pins; and (iii) a plastic shell configured to plastic coat the chip and the lead frame, and to expose the extension portion to allow electrical connectivity between the flip packaging device and a peripheral circuit.

Embodiments of the present invention can provide several advantages over conventional approaches, as may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

The present invention relates to a lead frame, and a flip-chip package device utilizing the lead frame. In one embodiment, a lead frame can include: (i) a plurality of pins, wherein each of the plurality of pins includes an intermediate portion and an extension portion that are connected to each other; (ii) where the intermediate portion is located at an interior region of the lead frame, the intermediate portion extending to a first side edge of the lead frame; and (iii) where the extension portion is located at a peripheral region of the lead frame, the peripheral region being different than the first side edge.

In one embodiment, a flip-chip package can include: (i) a chip, where an upper surface of the chip includes a plurality of bumps; (ii) the lead frame as above, where each the bump is connected to an intermediate portion of the plurality of pins; and (iii) a plastic shell configured to plastic coat the chip and the lead frame, and to expose the extension portion to allow electrical connectivity between the flip packaging device and a peripheral circuit.

Figure 1:
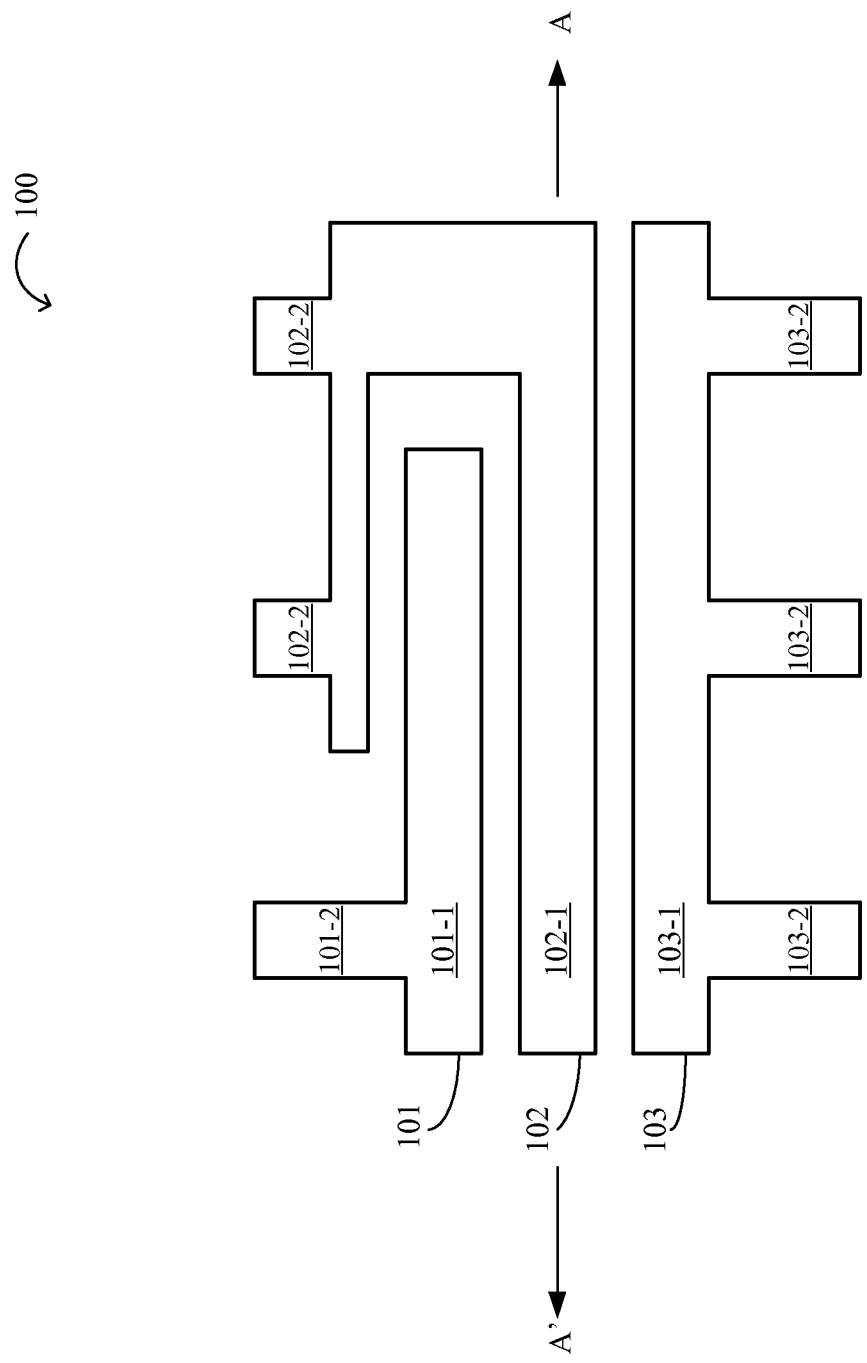
FIG. 1 is a structure diagram of a first example lead frame in accordance with embodiments of the present invention.

Referring now to FIG. 1, shown is a structure diagram of a first example lead frame in accordance with embodiments of the present invention. Lead frame 100 can include a plurality of pins, such as pin 101, pin 102, and pin 103. Each of the pins can include an intermediate portion and an extension portion that are connected to each other. For example, pin 101 can include intermediate portion 101-1 and extension portion 101-2, pin 102 can include intermediate portion 102-1 and two extension portions 102-2, and pin 103 can include intermediate portion 103-1 and three extension portions 103-2, as shown.

When the lead frame is utilized as part of a package (e.g., a flip-chip package) to package the chip, the intermediate portion can be used for connection to pads on the chip. Thus, a pin may have an electrical potential or same signal value as that of the pad to which it is connected on the chip. The extension portions can be used for electrical connectivity between a given pin and peripheral or external circuitry. For example, the intermediate portions can connect to various signal pads or supply pads on the chip, while the extension portions can provide connectivity between these pads on the chip and external or peripheral circuitry via the given pin.

For example, the intermediate portion can be located at an interior area or region of lead frame 100. In this particular example, three intermediate portions 101-1, 102-1, and 103-1 can be extended to a first side (e.g., a leftmost edge) of lead frame 100 along axis A-A'. The first portions of intermediate portion 101-1, 102-1, and 103-1 that are extended to the side can be arranged in parallel as shown. Extension portions of the pins can be located at peripheral regions of lead frame 100 that are different from the first side. In this example, extension portions 101-2, 102-2, and 103-2 can be uniformly distributed on the two opposite sides (e.g., top and bottom sides of FIG. 1) of lead frame 100 that are perpendicular to axis A-A', so as to facilitate the subsequent packaging process.

Based on the particular chip/package application, various arrangements of the extension portions of lead frame 100 can be supported in particular embodiments. For example, the number and/or of the extension portions can be arranged based on the application. In some cases, multiple pins may be arranged accordingly, and the shape of the pins can be correspondingly different. For example, outside pins 101 and 103 including intermediate portions 101-1 and 103-1 in a substantially regular rectangular shape, while intermediate portions 102-1 of pin 102 located at a middle or center region can be in a substantially bent shape. This example arrangement can extend to the peripheral region of the lead frame in order to facilitate configuration of extension portions 102-2. Of course, the extension portions can be located at part or the entire peripheral region of the lead frame excluding the first or leftmost side as shown.

Through the example lead frame shown in FIG. 1, a plurality of discrete finger-shape pins can be arranged compactly, and the area of the lead frame can be relatively small. Also, the shape of the pins can be regular and simple, and by extending pins along axis A-A', lead frame expansion can be facilitated. Further, different shapes of pins can be supported in order to facilitate pin arrangement.

Figure 2:
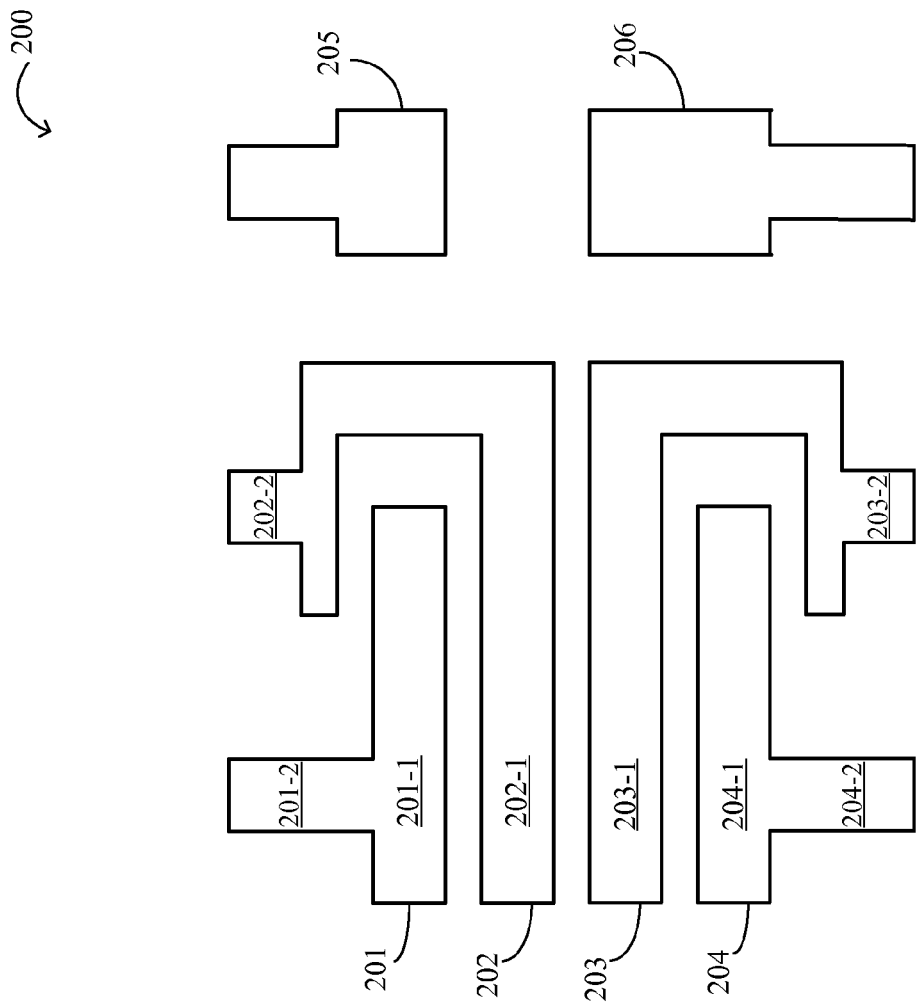
FIG. 2 is a structure diagram of a second example lead frame in accordance with embodiments of the present invention.

Referring now to FIG. 2, shown is a structure diagram of a second example lead frame in accordance with embodiments of the present invention. In this example, lead frame 200 can include different types (e.g., functional or pin assignment types) of pins, such as a plurality of first type pins 201, 202, 203, and 204, and a plurality of second type pins 205 and 206. In this example, the implementation of first type pins 201, 202, 203, and 204 can be the same or similar to the specific implementation shown in FIG. 1. Thus, intermediate portions 201-1, 202-1, 203-1, and 204-1 of first type pins 201, 202, 203, and 204 can be extended to the first or leftmost side of lead frame 200.

In particular embodiments, the lead frame can be adjusted to fit the size of the chip and/or printed-circuit board (PCB). When the lead frame is to be extended, the length of intermediate portions 201-1, 202-1, 203-1, and 204-1 can be increased along the extending direction, and area of the lead frame can be correspondingly increased. Extension portions of all the pins can be located at a peripheral region of lead frame 200 that may be different from the first or leftmost side. For example, the peripheral region can include any remaining sides of lead frame 200 except the first (e.g., leftmost) side, such as to sides among them, or all three remaining sides. In this particular example, the extension portion can be located at two opposite sides (e.g., top and bottom) of lead frame 200 that are perpendicular to the first (e.g., left) side.

In one example arrangement, a plurality of first type pins 201, 202, 203, and 204 can be located at a first (e.g., left) side in lead frame 200, and a plurality of second type pins 205 and 206 can be located at the opposite (e.g., right) side of lead frame 200. This can facilitate extension of first type pins 201, 202, 203 and 204. In particular embodiments, different pins can be divided into zones, and the first type pins for extension can be arranged in a first region of the lead frame, while remaining second type pins can be arranged in a second region of the lead frame. The second type pins may thus not affect the area extension of the first type pins. Through such a pin arrangement, the area of the lead frame can be minimized while facilitating expansion of the lead frame.

Figure 3:
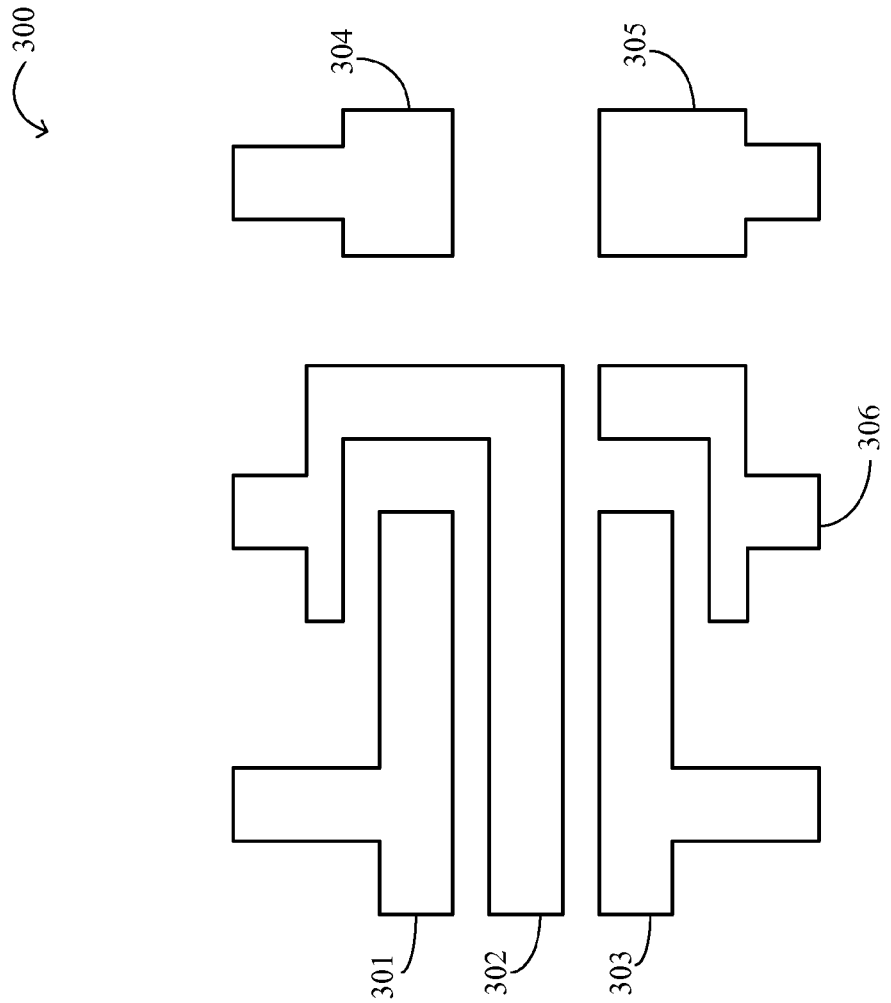
FIG. 3 is a structure diagram of a third example lead frame in accordance with embodiments of the present invention.

Referring now to FIG. 3, shown is a structure diagram of a third example lead frame in accordance with embodiments of the present invention. Different from the lead frame in FIG. 2, in this particular example, lead frame 300 can include three first type pins 301, 302, and 303, two second type pins 304 and 305, and one third type pin 306. In conventional packaging, pins that are used for electrical connection with external circuitry can generally be located at two opposite sides of the packaging device, and the arrangement and number of the pins can generally be symmetrical. However, in the example shown in FIG. 3, lead frame 300 can include an odd number (e.g., 3) of first type pins, and the corresponding number of the extension portions can also be odd.

In order to achieve a symmetric configuration of pins in a packaging device, one approach is represented in the example of FIG. 1 where the extension portion of one of the pins can be set to two to meet number of pins. Another approach is, in the corresponding area of the pins in the packaging device, third type pin 306 can be set, and symmetric configuration of the pins in the packaging device can be achieved through the extension portion of third type pin 306. In some applications, third type pin 306 can be set to be a vacant or no connect (N/C) pin. Similarly, when the number of second type pins is odd, the second type pins can also be set as the third type pins for a symmetric configuration of the pins in the packaging device.

Based on the above lead frame examples, by arranging different types of pins to layout the extension portions sequentially with spaces, overlap or crossing can be avoided. This approach can achieve optimum arrangement and distribution of the lead frame according to the particular number of pins and packaging process of the lead frame.

Figure 4:
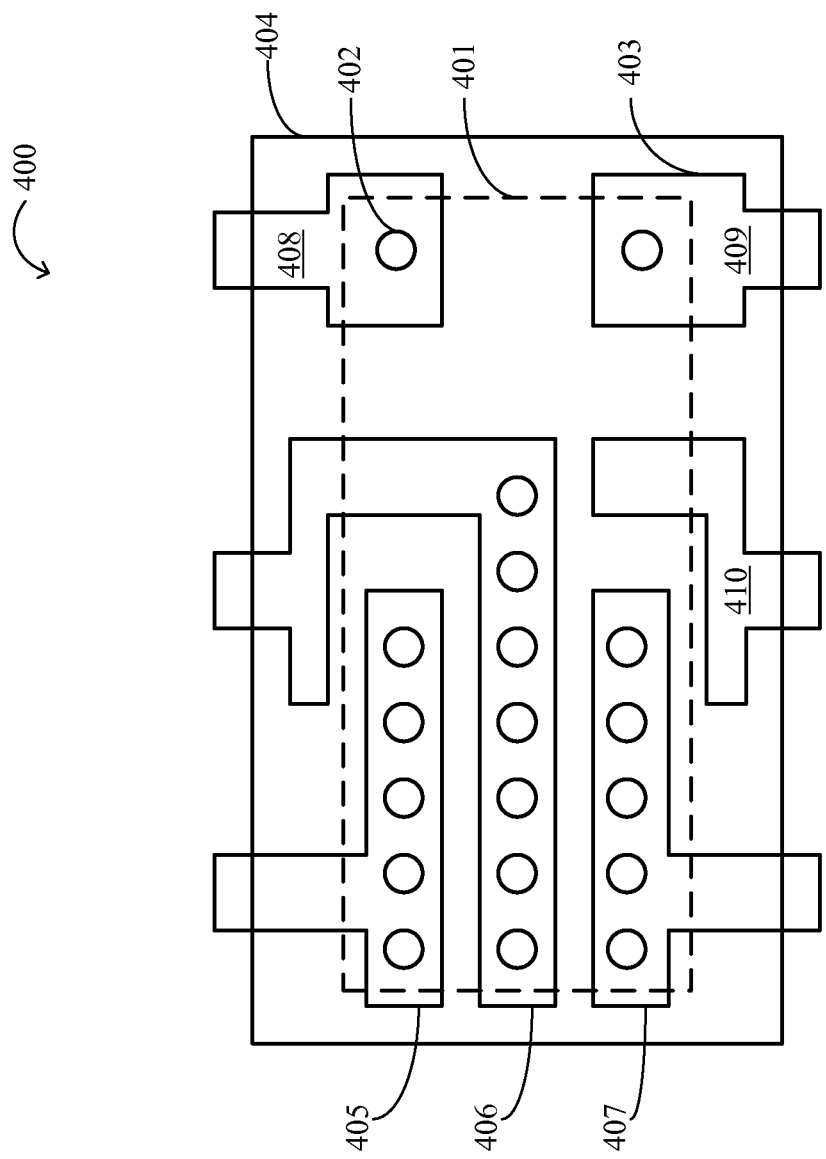
FIG. 4 is a structure diagram of an example flip-chip package device in accordance with embodiments of the present invention.

Referring to FIG. 4, shown is a structure diagram of an example flip-chip package device in accordance with embodiments of the present invention. In this example, flip packaging device 400 can include chip 401, a plurality of bumps 402, lead frame 403 formed by a plurality of pins, and plastic shell 404. Bumps 402 can be located on a plurality of pads on the upper surface of chip 401 in order to provide electrical conductivity to the pads of chip 401. For example, bumps 402 can be directly connected to the intermediate portion of the pins in lead frame 403. Lead frame 403 can be any suitable form of lead frame in particular embodiments, e.g., any one of the lead frames shown in FIGS. 1-3.

Plastic shell 404 can be used to package chip 401, bumps 402, and lead frame 403. The package can expose the extension portions of pins in lead frame 403 to allow for electrical conductivity to peripheral or external circuitry. In this example, bumps 402 can directly bond to lead frame 403, which may help in cooling chip 401. Bumps 402 being directly bonded to lead frame 403 can also reduce package resistance between the lead frame and the chip, which can help to reduce our losses.

FIG. 4 is an implementation of a flip-chip package device that is particularly suitable for packaging high power integrated circuitry. For example, an integrated switching power supply can include a high power device and a control circuit that controls the switching state of the power device. The power device may handle relatively large currents, and may take up a significant portion of the area of the integrated switching power supply. The current of the control circuit can be relatively small, thus the area occupied by the control circuit can be relatively small.

The intermediate portion of pin 405 can be connected to a plurality of bumps for the input voltage. The intermediate portion of pin 406 can be connected to a plurality of bumps for the output voltage. The intermediate portion of pin 407 can be connected to a plurality of bumps for ground. Accordingly, the exposed extension portion of pin 405 can be used as an input pin of device 400. The exposed extension portion of pin 406 can be used as an output pin of device 400. The exposed extension portion of pin 407 can be used as a ground pin of device 400. Also, intermediate portions of pins 405, 406, and 407 can be extended to the left side as shown.

When performance parameters of the integrated switching power supply are to be changed, the area of the power device in chip may be changed accordingly. Also, the area of first type pins 405, 406, and 407 may also be changed accordingly, which can be achieved by changing the length of the intermediate portions of extension portions of first type pins 405, 406, and 407. For example, second type pins 408 and 409 can be located at the right side of lead frame 400 for electrical connection to the control circuit. Also for example, third type pin 410 can be located at the lower middle region of lead frame 400 to provide symmetry of the pins in device 400.

The flip-chip package device shown in FIG. 4 can also be utilized in a multi-chip package structure. In a switching power supply, the flip packaging device can include at least one power device chip and a control chip. For example, the power device chip can be located in a left area of the lead frame, and the control chip can be located in a right area of the lead frame. Similarly, the area of the intermediate portions of the extension portions of first type pins can be increased for expanding where appropriate.

The above described flip packaging device in accordance with embodiments of the present invention may have a relatively compact pin arrangement and area/volume. Also, extending pins and increasing the corresponding packaging area can be supported without substantially changing the package structure. In addition, various alternatives to the particular lead frame and flip-chip package examples shown can be supported in certain embodiments. For example, materials other than plastic (e.g., ceramic, etc.) can be employed in order to coat or at least partially enclose the lead frame and chip. In addition, other arrangements and shapes of pins, as well as other types or numbers of types of pins, can also be supported in particular embodiments.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A lead frame, comprising:
    a) a plurality of pins, wherein each of said plurality of pins comprises an intermediate portion and an extension portion that are connected to each other;
    b) said intermediate portion being located at an interior region of said lead frame, said intermediate portion comprising a first portion for each of said plurality of pins, each said first portion being arranged in parallel and extending to a first side edge of said lead frame; and
    c) said extension portion being located at a peripheral region of said lead frame, said peripheral region being different than said first side edge.

2. The lead frame of claim 1, wherein said intermediate portion comprises a rectangular shape.

3. The lead frame of claim 1, wherein said intermediate portion comprises a bent shape.

4. The lead frame of claim 1, wherein said plurality of pins comprises a plurality of first type pins and a plurality of second type pins, wherein:
    a) said first type pins are located at a first region adjacent to said first side edge; and
    b) said second type pins are located at a second region opposite said first region.

5. The lead frame of claim 4, wherein when a number of said plurality of pins is odd, said plurality of pins further comprises a plurality of third type pins, said third type pins being configured to achieve symmetrical arrangement of said extension portion.

6. A flip-chip package, comprising:
    a) a chip, wherein an upper surface of said chip comprises a plurality of bumps;
    b) said lead frame of claim 1, wherein each said bump is connected to an intermediate portion of said plurality of pins; and
    c) a plastic shell configured to plastic coat said chip and said lead frame, and to expose said extension portion to allow electrical connectivity between said flip packaging device and a peripheral circuit.

7. The flip-chip package of claim 6, wherein:
    a) said chip comprises an integrated switching power supply;
    b) said plurality of bumps comprises an input bump, an output bump, and a ground bump; and
    c) said plurality of pins comprises an input pin, an output pin, and a ground pin.

8. The flip-chip package of claim 6, wherein said chip comprises at least one power device chip and a control chip.

* * * * *